(12) United States Patent
Wong et al.

(10) Patent No.: US 8,901,674 B2
(45) Date of Patent: Dec. 2, 2014

(54) SCALING OF METAL GATE WITH ALUMINUM CONTAINING METAL LAYER FOR THRESHOLD VOLTAGE SHIFT

(71) Applicant: International Business Machines Corporation, Armonk, NY (US)

(72) Inventors: Keith Kwong Hon Wong, Wappingers Falls, NY (US); Dechao Guo, Fishkill, NY (US); Unoh Kwon, Fishkill, NY (US); Christopher Carr Parks, Poughkeepsie, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/775,430

(22) Filed: Feb. 25, 2013

(65) Prior Publication Data

US 2013/0175642 A1 Jul. 11, 2013

Related U.S. Application Data

(62) Division of application No. 12/607,110, filed on Oct. 28, 2009, now abandoned.

(51) Int. Cl.

| | |
|---|---|
| *H01L 21/02* | (2006.01) |
| *H01L 29/02* | (2006.01) |
| *H01L 21/70* | (2006.01) |
| *H01L 21/8238* | (2006.01) |
| *H01L 21/4763* | (2006.01) |
| *H01L 21/28* | (2006.01) |
| *H01L 29/51* | (2006.01) |
| *H01L 29/49* | (2006.01) |
| *H01L 29/40* | (2006.01) |
| *H01L 29/66* | (2006.01) |

(52) U.S. Cl.
CPC ........ *H01L 29/511* (2013.01); *H01L 21/28079* (2013.01); *H01L 29/51* (2013.01); *H01L 29/66545* (2013.01); *H01L 21/28088* (2013.01); *H01L 29/4966* (2013.01); *H01L 29/665* (2013.01); *H01L 29/517* (2013.01); *H01L 29/401* (2013.01); *H01L 29/4958* (2013.01)
USPC .... 257/406; 257/369; 257/402; 257/E21.639; 257/E29.16; 438/216; 438/591

(58) Field of Classification Search
USPC ............ 257/369, 402, 407, E21.639, E29.16; 438/216, 591
See application file for complete search history.

(56) References Cited

U.S. PATENT DOCUMENTS

| | | | | |
|---|---|---|---|---|
| 5,518,959 | A | * | 5/1996 | Jang et al. ...................... 438/627 |
| 6,642,132 | B2 | * | 11/2003 | Cho et al. ...................... 438/592 |

(Continued)

FOREIGN PATENT DOCUMENTS

JP 20090267180 11/2009

OTHER PUBLICATIONS

Dae-Gyu Park, et al., Robust Ternary Metal Gate Electrodes for Dual Gate CMOS Devices, IEEE, Dec. 2, 2001, pp. 30.6.1-30.6.4.

*Primary Examiner* — Cheung Lee
*Assistant Examiner* — Jeremy Joy
(74) *Attorney, Agent, or Firm* — Scully, Scott, Murphy & Presser, P.C.; H. Daniel Schnurmann

(57) ABSTRACT

A method of forming a p-type semiconductor device is provided, which in one embodiment employs an aluminum containing threshold voltage shift layer to produce a threshold voltage shift towards the valence band of the p-type semiconductor device. The method of forming the p-type semiconductor device may include forming a gate structure on a substrate, in which the gate structure includes a gate dielectric layer in contact with the substrate, an aluminum containing threshold voltage shift layer present on the gate dielectric layer, and a metal containing layer in contact with at least one of the aluminum containing threshold voltage shift layer and the gate dielectric layer. P-type source and drain regions may be formed in the substrate adjacent to the portion of the substrate on which the gate structure is present. A p-type semiconductor device provided by the above-described method is also provided.

8 Claims, 6 Drawing Sheets

(56) References Cited

U.S. PATENT DOCUMENTS

| | | | |
|---|---|---|---|
| 7,084,024 B2* | 8/2006 | Gluschenkov et al. | 438/199 |
| 7,135,421 B2 | 11/2006 | Ahn et al. | |
| 7,316,950 B2* | 1/2008 | Park et al. | 438/199 |
| 7,374,964 B2* | 5/2008 | Ahn et al. | 438/104 |
| 7,432,164 B2* | 10/2008 | Adetutu et al. | 438/276 |
| 7,432,567 B2* | 10/2008 | Doris et al. | 257/407 |
| 7,521,345 B2* | 4/2009 | Park et al. | 438/591 |
| 7,547,951 B2* | 6/2009 | Lim et al. | 257/410 |
| 7,655,550 B2* | 2/2010 | Schaeffer et al. | 438/592 |
| 7,994,051 B2* | 8/2011 | Hung et al. | 438/652 |
| 8,120,117 B2* | 2/2012 | Tsuchiya | 257/369 |
| 2004/0036129 A1* | 2/2004 | Forbes et al. | 257/407 |
| 2005/0064653 A1* | 3/2005 | Park et al. | 438/232 |
| 2005/0233550 A1* | 10/2005 | Fujihara et al. | 438/462 |
| 2006/0068575 A1* | 3/2006 | Gluschenkov et al. | 438/585 |
| 2006/0131652 A1* | 6/2006 | Li | 257/350 |
| 2006/0177975 A1* | 8/2006 | Ahn et al. | 438/197 |
| 2006/0237796 A1* | 10/2006 | Cartier et al. | 257/371 |
| 2007/0001241 A1* | 1/2007 | Lim et al. | 257/410 |
| 2008/0150036 A1* | 6/2008 | Jung et al. | 257/369 |
| 2008/0261360 A1* | 10/2008 | Jung et al. | 438/199 |
| 2009/0020824 A1* | 1/2009 | Kadoshima | 257/369 |
| 2009/0065873 A1* | 3/2009 | Park et al. | 257/372 |
| 2009/0179283 A1* | 7/2009 | Adams et al. | 257/411 |
| 2009/0186455 A1* | 7/2009 | Bedell et al. | 438/199 |
| 2009/0212369 A1* | 8/2009 | Park et al. | 257/368 |
| 2009/0283838 A1* | 11/2009 | Park et al. | 257/369 |
| 2009/0302399 A1* | 12/2009 | Cartier et al. | 257/407 |
| 2009/0325372 A1* | 12/2009 | Harada | 438/591 |
| 2010/0013021 A1* | 1/2010 | Chen et al. | 257/369 |
| 2010/0096705 A1* | 4/2010 | Hung et al. | 257/411 |
| 2010/0213555 A1* | 8/2010 | Hargrove et al. | 257/411 |
| 2010/0276760 A1* | 11/2010 | Tsuchiya | 257/369 |
| 2011/0272766 A1* | 11/2011 | Hung et al. | 257/411 |

\* cited by examiner

SCALING OF METAL GATE WITH ALUMINUM CONTAINING METAL LAYER FOR THRESHOLD VOLTAGE SHIFT

CROSS REFERENCE TO RELATED APPLICATION

This application is a divisional of U.S. patent application Ser. No. 12/607,110, filed Oct. 28, 2009 the entire content and disclosure of which is incorporated herein by reference.

BACKGROUND

The present disclosure relates generally to semiconductor devices, and more particularly to threshold voltage modifications in semiconductor devices.

P-type field effect transistors (pFET) formed on silicon containing substrates typically employ a gate structure including a boron (or other acceptor) doped p-type polysilicon layer as a gate electrode deposited on top of a silicon dioxide or silicon oxynitride gate oxide layer. The gate voltage is applied through this polysilicon layer to create an inversion channel in the n-type silicon underneath the gate oxide layer. For a pFET to work properly, the inversion should begin occurring at slightly negative voltages applied to the polysilicon (poly-Si) gate electrode. This occurs as a consequence of the band alignment for the gate stack structure. For example, a poly-Si/gate oxide/n-type silicon stack forms a capacitor that swings into inversion at around 0 V. The threshold voltage Vt, which can be interpreted as the voltage at which the inversion starts occurring, is therefore approximately 0 V. The exact value of the threshold voltages has some dependence on the doping level in the silicon substrate, and can be varied somewhat by choosing an appropriate substrate doping level. When p-type field effect transistors are fabricated using a dielectric, such as hafnium oxide or hafnium silicate, the flatband voltage of the device is shifted from its ideal position of close to about +1 V, to about 0+/−300 mV.

SUMMARY

A method of forming a p-type semiconductor device is provided, which in one embodiment employs an aluminum containing threshold voltage shift layer to produce a threshold voltage shift towards the valence band of the p-type semiconductor device. The method of forming the p-type semiconductor device may include forming a gate structure on a substrate, in which the gate structure includes a gate dielectric layer positioned on the substrate, and an aluminum containing threshold voltage shift layer positioned on the gate dielectric layer. A metal-containing layer may also be present on the aluminum containing threshold voltage shift layer. The metal containing layer may be a metal nitride layer or a metal gate conductor. A p-type source region and a p-type drain region (hereinafter "p-type source and drain region") may be formed in the substrate adjacent to the portion of the substrate on which the gate structure is present.

In another embodiment, a p-type semiconductor device may be provided by a method that includes forming a gate dielectric layer positioned on a substrate, in which the gate dielectric layer includes an aluminum containing threshold voltage shift layer embedded therein. Forming a metal containing layer positioned on the gate dielectric layer. A gate structure is then formed from the gate dielectric layer, the aluminum containing threshold voltage shift layer and the metal containing layer, wherein the gate structure is present on a first portion of the substrate. P-type source and drain regions may be formed in the substrate adjacent to the first portion of the substrate on which the gate structure is present.

In a further embodiment, a p-type semiconductor device may be provided by a method that includes forming an aluminum containing threshold voltage shift layer on a substrate; forming a gate dielectric layer on the aluminum containing threshold voltage shift layer; forming a metal containing layer in contact with the gate dielectric layer; and forming a gate structure from the aluminum containing threshold voltage shift layer, the gate dielectric layer and the metal containing layer, wherein the gate structure is present on a first portion of the substrate. P-type source and drain regions are then formed in the substrate adjacent to the first portion of the substrate.

In another aspect of the invention, a p-type semiconductor device is provided, in which an aluminum containing threshold voltage shift layer that is present in the gate structure of the device induces a threshold voltage shift towards the valence band of the p-type semiconductor device. In one embodiment, the p-type semiconductor structure includes a gate structure present on a first portion of a silicon containing substrate, in which the gate structure includes a gate dielectric layer present on the silicon containing substrate, an aluminum containing threshold voltage shift layer present on the gate dielectric layer and a metal nitride layer present on the aluminum containing threshold voltage shift layer. P-type source and drain regions may be present in a portion of the silicon containing substrate that is adjacent to the first portion of the silicon containing substrate on which the gate structure is present, wherein the p-type semiconductor device has a threshold voltage ranging from −0.35 V to −0.1 V.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
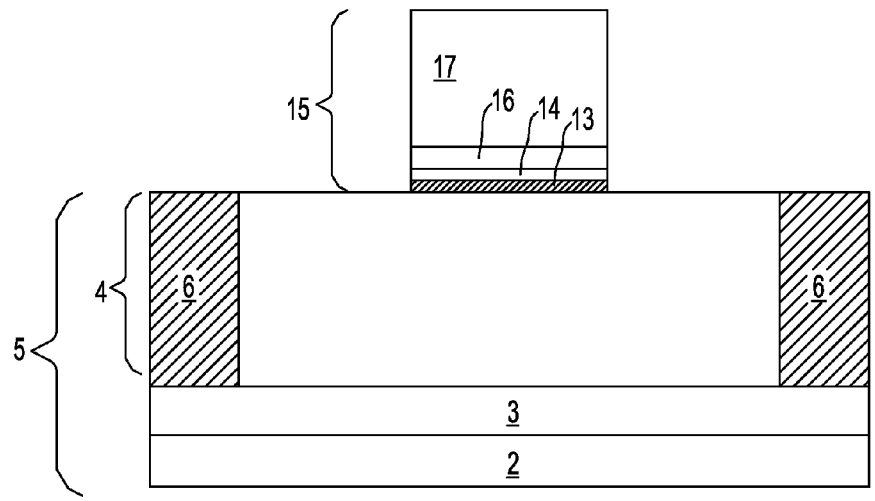
FIG. 1 is a side cross-sectional view depicting forming a gate structure on a substrate, in which the gate structure includes a gate dielectric layer present on the substrate, an aluminum containing threshold voltage shift layer on the gate dielectric layer, and a metal nitride layer present on the aluminum containing threshold voltage shift layer, in accordance with one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention provides a method of forming a p-type semiconductor device that positions an aluminum containing threshold voltage shift layer in a gate structure, wherein the aluminum containing threshold voltage shift layer effectuates a threshold voltage shift towards the valence band of the p-type semiconductor device. When describing the inventive methods and structures, the following terms have the following meanings, unless otherwise indicated.

A "gate structure" means a structure used to control output current (i.e., flow of carriers in the channel) of a semiconducting device, such as a field effect transistor (FET), and includes at least one gate conductor and at least one gate dielectric layer.

The "channel" is the portion of the substrate underlying the gate structure and between the source and drain dopant regions.

As used herein, a "gate dielectric" is a layer of an insulator between the semiconductor device substrate and the gate conductor.

A "gate conductor" means a conductive structure of the gate structure on the gate dielectric.

As used herein, the terms "insulating" and "dielectric" denote a material having a room temperature conductivity of less than $10^{-10}$ $(\Omega\text{-m})^{-1}$.

A "high-k" dielectric is a dielectric or insulating material having a dielectric constant that is greater than the dielectric constant of silicon oxide ($SiO_2$).

As used herein, "threshold voltage" is the lowest attainable gate voltage that will turn on a semiconductor device, e.g., transistor, by making the channel of the device conductive.

The term "inversion thickness" is a value extracted from valid inversion capacitance-voltage (C-V) measurement for the gate structure of a semiconductor device. Its derivation is described as:

$$T_{inv} = \frac{\varepsilon_0 \cdot \varepsilon_{SiO2}}{C_{max}},$$

where $\varepsilon_0$ is vacuum permittivity, $\varepsilon_{SiO2}$ is $SiO_2$ dielectric constant, and $C_{max}$ is the maximum inversion capacitance from the above mentioned C-V measurement.

"Threshold voltage shift" as used herein means a shift in the Fermi energy of a p-type semiconductor device towards a valence band of silicon in the silicon containing substrate of the p-type semiconductor device.

A "valence band" is the highest range of electron energies where electrons are normally present at absolute zero.

The term "direct physical contact" means that a first element, such as a first structure, and a second element, such as a second structure, are connected without any intermediary conducting, insulating or semiconductor layers at the interface of the two elements.

The terms "overlying", "atop", "positioned on" or "positioned atop" mean that a first element, such as a first structure, is present on a second element, such as a second structure, wherein intervening elements, such as an interface structure may be present between the first element and the second element.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

Figure 2:
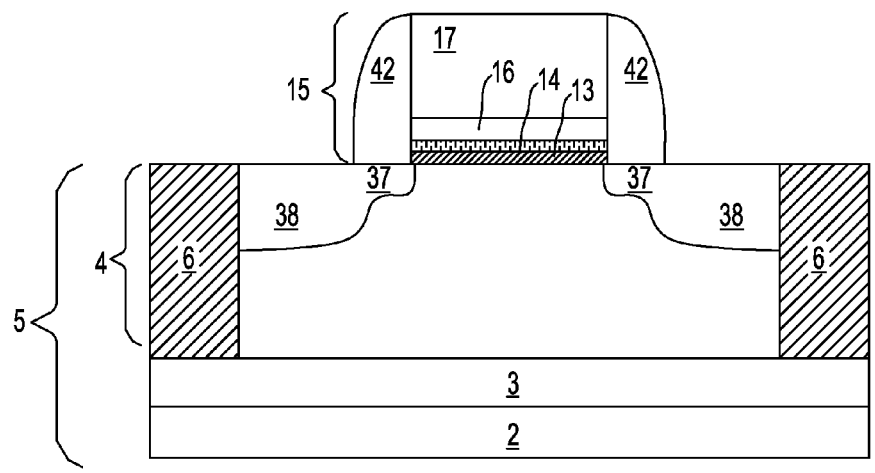
FIG. 2 is a side cross-sectional view depicting implanting dopants into the substrate to provide p-type source and drain regions, in accordance with one embodiment of the present invention.
Figure 3:
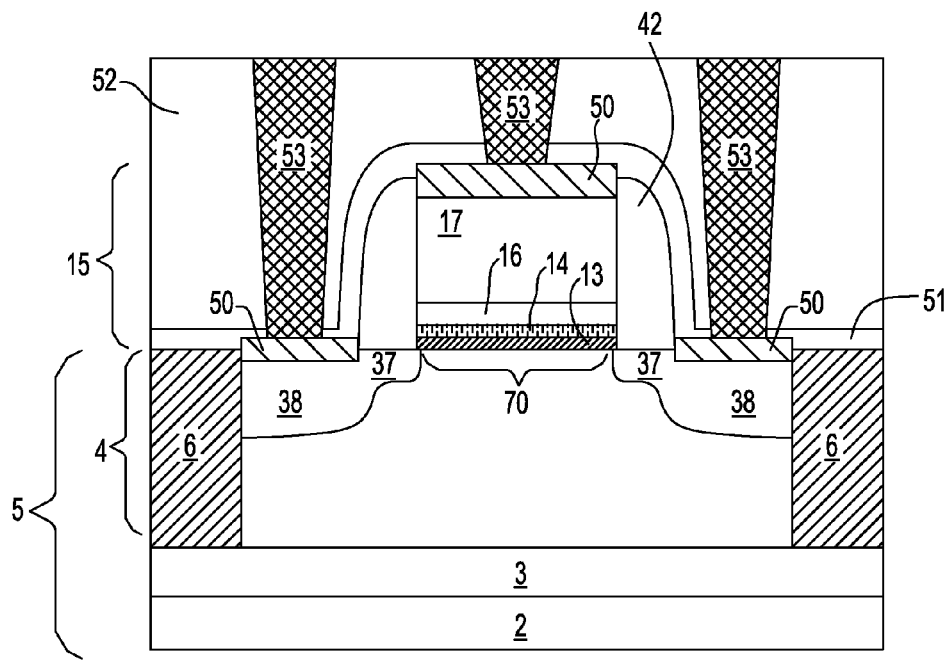
FIG. 3 is a side cross-sectional view depicting forming silicide contacts to the polysilicon gate conductor, the source region and the drain region of a semiconductor device in which the gate stack of the semiconductor device includes in order from top to bottom a gate stack composed of a polysilicon gate conductor, a metal nitride layer, aluminum containing threshold voltage shift layer, and a gate dielectric layer, in accordance with one embodiment of the present invention.

FIGS. 1-3 illustrate some of the basic processing steps that may be employed in one embodiment of a method of forming a p-type semiconductor device that positions an aluminum containing threshold voltage shift layer 14 in the gate structure 15 of the device. The aluminum containing threshold voltage shift layer 14 that is present in the gate structure 15 may produce a threshold voltage shift in the p-type semiconductor device. The threshold voltage shift is typically towards the valence band of the p-type semiconductor device. As used herein, "p-type" refers to the addition of trivalent impurities to an intrinsic semiconductor that creates deficiencies of valence electrons. In one example, the addition of boron, aluminum, or gallium to a type IV semiconductor, such as Si, creates deficiencies of valence electrons.

FIG. 1 depicts one embodiment of forming a gate structure 15 on a substrate 5, in which the gate structure 15 includes a gate dielectric layer 13 present on the substrate 5, an aluminum containing threshold voltage shift layer 14 present on the gate dielectric layer 13, and a metal nitride layer 16 present on the aluminum containing threshold voltage shift layer 14. The substrate 5 may include, but is not limited to, silicon containing materials, GaAs, InAs and other like semiconductors. Silicon containing materials as used to provide the substrate 5 include, but are not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment in which the substrate 5 is a silicon-on-insulator (SOI) or SiGe-on-insulator (SGOI) substrate, the silicon containing layer 4 (also referred to as SOI layer) that is atop the buried insulating layer 3 can have a thickness greater than 10 nm. The buried insulating layer 3 may be composed of an oxide, such as silicon oxide, and may have a thickness ranging from 10 nm to 100 nm. The thickness of the silicon containing layer 2 that is underlying the buried insulating layer 3 may range from 10 nm to 500 nm. The SOI or SGOI substrate may be fabricated using a thermal bonding process, or may be fabricated by an ion implantation process.

The substrate 5 may further include trench isolation regions 6. The trench isolation regions 6 can be formed by etching a trench in the silicon containing layer 4 utilizing a dry etching process, such as reactive-ion etching (RIE) or plasma etching. The trenches may optionally be lined with a liner material, e.g., an oxide, and then CVD or another like deposition process is used to fill the trench with oxide grown from tetraethylorthosilicate (TEOS) precursors, high-density oxide or another like trench dielectric material. After trench dielectric fill, the structure may be subjected to a planarization process.

Still referring to FIG. 1, the gate structure 15 may be formed atop the substrate 5 utilizing deposition, lithography and etching processes. More specifically, in one embodiment, a gate structure 15 may be provided atop the substrate 5 by blanket depositing the layers of a gate stack, and then patterning and etching the gate stack to provide the gate structure 15. For example, forming the gate stack may include blanket deposition of material layers including the gate dielectric layer 13, the aluminum threshold voltage shift layer 14, and the metal nitride layer 16. In one example, the gate stack further includes a conductive semiconductor layer 17 present on the metal nitride layer 16.

The gate stack may be patterned using photolithography and etching to produce the gate structure 15. In one example, following the deposition of the gate dielectric layer 13, the aluminum containing threshold voltage shift layer 14, the metal nitride layer 16, and the conductive semiconductor layer 17 (when present), an etch mask may be formed atop the uppermost layer of the gate stack, e.g., the metal nitride layer 16 or conductive semiconductor layer 17 (when present). The etch mask typically protects the portion of the layered stack that provides the gate structure 15, wherein the portions exposed by the etch mask are removed by an anisotropic etch process, such as a reactive ion etch. Reactive ion etch is a form of plasma etching, in which the surface to be etched is placed on the RF powered electrode and takes on a potential that accelerates an etching species, which is extracted from a plasma, towards the surface to be etched, wherein a chemical etching reaction takes place in the direction normal to the surface being etched. In one embodiment, the etch mask may be provided by a patterned photoresist layer.

The gate dielectric layer 13 of the gate structure 15 may be composed of an oxide material. Suitable examples of oxides that can be employed as the gate dielectric layer 13 include, but are not limited to: $SiO_2$, $Al_2O_3$, $ZrO_2$, $HfO_2$, $Ta_2O_3$, perovskite-type oxides and combinations and multi-layers thereof. The gate dielectric layer 13 may be composed of a high k dielectric having a dielectric constant of greater than about 4.0, and in some embodiments greater than 7.0. The high k dielectric may include, but is not limited to, an oxide, nitride, oxynitride and/or silicate including metal silicates and nitrided metal silicates. In one embodiment, the high-k dielectric is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high k dielectrics suitable for use as the gate dielectric layer 13 in the present method include hafnium silicate and hafnium silicon oxynitride.

The gate dielectric layer 13 can be formed by a thermal growth process such as, for example, oxidation, nitridation or oxynitridation. The gate dielectric layer 13 can also be formed by a deposition process such as, for example, chemical vapor deposition (CVD), plasma-assisted CVD, metal-organic chemical vapor deposition (MOCVD), atomic layer deposition (ALD), evaporation, reactive sputtering, chemical solution deposition and other like deposition processes. The gate dielectric layer 13 may also be formed utilizing any combination of the above processes. The gate dielectric layer 13 typically has a thickness ranging from 1 nm to 10 nm. In one example, the gate dielectric layer 13 has a thickness ranging from 2 nm to 5 nm. In one embodiment, the gate dielectric layer 13 is in direct physical contact with a surface, e.g., upper surface, of the substrate 5.

The aluminum containing threshold voltage shift layer 14 of the gate structure 15 may be composed of an aluminum containing conductive material, which may be substantially pure aluminum. In one embodiment, by "substantially pure" aluminum it is meant that the aluminum content of the aluminum containing threshold voltage shift layer 14 is greater than 99.0%. In some embodiments, the aluminum content of the aluminum containing threshold voltage shift layer 14 may be greater than 99.5%. The aluminum containing threshold voltage shift layer 14 may have a thickness of less than 10 Å. In one embodiment, the aluminum containing threshold voltage shift layer 14 ranges from 1 Å to 5 Å. In another embodiment, the aluminum containing threshold voltage shift layer ranges from 2 Å to 3 Å. In another embodiment, the aluminum containing threshold voltage shift layer 14 has a thickness of less than 2 Å. In one example, the aluminum containing threshold voltage shift layer 14 that is composed of substantially pure aluminum is in direct physical contact with a surface, e.g., upper surface, of the gate dielectric layer 13.

The aluminum containing threshold voltage shift layer 14 may deposited by a physical vapor deposition (PVD) method, such as sputtering. As used herein, "sputtering" means a method of depositing a film of metallic material, in which a target of the desired material, i.e., source, is bombarded with particles, e.g., ions, which knock atoms from the target, and the dislodged target material deposits on the deposition surface. Examples of sputtering apparatus that may be suitable for depositing the aluminum containing threshold voltage shift layer 14 include DC diode type systems, radio frequency (RF) sputtering, magnetron sputtering, and ionized metal plasma (IMP) sputtering.

In one embodiment, a sputtering deposition process for depositing the aluminum containing threshold voltage shift layer 14 includes applying high energy particles to strike a solid slab of high-purity aluminum target material, in which the high energy particles physically dislodge atoms of the aluminum to be deposited on the gate dielectric layer 13. In one example, the ion energies of the high-energy particles, e.g., positive ions from an argon gas flow discharge, range from 500 eV to 5,000 eV. In another embodiment, the ion energies of the high-energy particles range from 1,500 eV to 4,500 eV. In one embodiment, by high-purity aluminum it is meant that the aluminum content of the target material is greater than 99.0%. In some embodiments, the aluminum content of the target material may be as great as 99.95% with a remainder of incidental impurities. "Incidental impurities" denote any contamination of the target, i.e., aluminum. Allowable ranges of impurities are less than 0.05 wt % for each impurity constituent and 0.15 wt % for total impurity content. The sputtered aluminum atoms from the aluminum target may migrate through a vacuum and deposit on the deposition surface, e.g., the gate dielectric layer 13. In one example, iron (Fe), copper (Cu), and silver (Ag) may be present in less than 5 parts per million (ppm). In another example, uranium (U), thorium (Th) and other radioactive elements may be present in less than 100 parts per billion (ppb).

Although physical vapor deposition (PVD) techniques have been described above for forming the aluminum containing threshold voltage shift layer 14, chemical vapor deposition (CVD) and atomic layer deposition (ALD) have also been contemplated as a suitable deposition methods for forming the aluminum containing threshold voltage shift layer 14.

In another embodiment, the aluminum containing threshold voltage shift layer 14 may be composed of titanium aluminum nitride (TiAlN). In one example, the titanium content of the titanium aluminum nitride may range from 20 wt % to 80 wt %, the aluminum content of the titanium aluminum nitride may range from 20 wt % to 60 wt %, and the nitrogen content of the titanium aluminum nitride may range from 20 wt % to 60 wt %. In another example, the titanium content of the titanium aluminum nitride may range from 30 wt % to 60 wt %, the aluminum content of the titanium aluminum nitride may range from 25 wt % to 40 wt %, and the nitrogen content of the titanium aluminum nitride may range from 25 wt % to 50 wt %.

The titanium aluminum nitride may be deposited using physical vapor deposition (PVD), such as sputtering. In one embodiment, a sputtering deposition process for depositing titanium aluminum nitride (TiAlN) includes applying high energy particles to strike a solid slab of a titanium aluminum alloy target material, in which the high energy particles physically dislodge atoms of titanium and aluminum to be deposited on the gate dielectric layer 13. In another embodiment, the sputtering apparatus may include dual targets, e.g., a first target composed of titanium and a second target composed of aluminum. The sputtered atoms of titanium and aluminum typically migrate through a vacuum and deposit on the deposition surface, e.g., the gate dielectric layer 13. In one example, the ion energies of the high-energy particles, e.g., positive ions from an argon gas flow discharge range from 500 eV to 5,000 eV. In another embodiment, the ion energies of the high-energy particles range from 1,500 eV to 4,500 eV.

The source of nitrogen for the titanium aluminum nitride (TiAlN) may be provided by nitrogen gas ($N_2$). The nitrogen source may be introduced to the sputtering chamber as the sputtered atoms of titanium and aluminum are migrating towards the deposition surface, e.g., the gate dielectric layer 13. In one example, the nitrogen source is provided by co-sputtering from a titanium (Ti) and an aluminum (Al) target in an $Ar/N_2$ gas mixture. In one example, the aluminum containing threshold voltage shift layer 14 composed of titanium aluminum nitride may be in direct physical contact with a surface, e.g., upper surface, of the gate dielectric layer 13.

The metal nitride layer 16 that is present on the aluminum containing threshold voltage shift layer 14 may be composed of TiN, TaN, WN or a combination thereof. It is noted that the metal nitride layer 16 may be composed of other metal materials, so long as the metal nitride layer 16 does not include aluminum. In one embodiment, the metal nitride layer 16 may have a thickness ranging from 25 Å to 200 Å. In another embodiment, the metal nitride layer 16 has a thickness ranging from 50 Å to 100 Å.

The metal nitride layer 16 may be deposited using physical vapor deposition (PVD), such as sputtering. In one embodiment, the sputtering deposition process for forming the metal nitride layer 16 includes applying high-energy particles to strike a solid slab of a metal target material to provide the metal constituent of the metal nitride layer 16, such as titanium. The high-energy particles physically dislodge metal atoms of target material, which are then deposited on the aluminum containing threshold voltage shift layer 14.

The source of nitrogen for the metal nitride layer 16 may be provided by nitrogen gas ($N_2$). The nitrogen source may be introduced to the sputtering chamber as the sputtered atoms of the metal constituent of the metal nitride layer 16 are migrating towards the deposition surface, e.g., the aluminum containing threshold voltage shift layer 14.

In one example, the metal nitride layer 16 is composed of titanium nitride (TiN), in which the titanium concentration ranges from 30% to 70%. In another example, the titanium concentration of the titanium nitride (TiN) metal nitride layer 16 ranges from 45% to 55%.

In the embodiments of the invention in which a conductive semiconductor layer 17 is present on the metal nitride layer 16, the conductive semiconductor layer 17 may be composed of single crystal Si, SiGe, SiGeC or combinations thereof. In another embodiment, the conductive semiconductor layer 17 may further comprise a metal and/or silicide. In other embodiments, the conductive semiconductor layer 17 is comprised of multi-layered combinations of the aforementioned conductive materials. In one example, the conductive semiconductor layer 17 is composed of a single layer of polysilicon. The conductive semiconductor layer 17 may be formed by chemical vapor deposition (CVD) or physical vapor deposition (PVD). In one embodiment, the conductive semiconductor layer 17 may be doped to a p-type conductivity. For example, the conductive semiconductor layer 17 may be doped with an element from group IIIA of the periodic table of elements, such as boron, with an ion implantation dose ranging from $1E15$ $cm^{-2}$ to about $5E16$ $cm^2$.

Variations of CVD processes suitable for forming the conductive semiconductor layer 17 include, but are not limited to, Atmospheric Pressure CVD (APCVD), Low Pressure CVD (LPCVD) and Plasma Enhanced CVD (EPCVD), Metal-Organic CVD (MOCVD) and combinations thereof. The conductive semiconductor layer 17 has a thickness ranging from 1 nm to 20 nm. In one example, the conductive semiconductor layer 17 has a thickness ranging from 5 nm to 10 nm. In one embodiment, the conductive semiconductor layer 17 is in direct physical contact with a surface, e.g., upper surface, of the metal nitride layer 16.

FIG. 2 depicts implanting dopants into the substrate 5 to provide p-type source and drain region. P-type source and drain extension regions 37 may be formed using an ion implantation process. More specifically, in one example, when forming p-type source and drain extension regions 37 the dopant species may be boron or $BF_2$. Boron may be implanted utilizing implant energies ranging 0.2 keV to 3.0 keV with an implant dose ranging from $5 \times 10^{14}$ atoms/cm$^2$ to $5 \times 10^{15}$ atoms/cm$^2$. $BF_2$ may be implanted utilizing implant energies ranging from 1.0 keV to 15.0 keV and having an implant dose ranging from $5 \times 10^{14}$ atoms/cm$^2$ to $5 \times 10^{15}$ atoms/cm$^2$.

Following the p-type source and drain extension regions 37 implantation, the structure may be annealed to promote diffusion of the dopant species. The p-type source and drain extension regions 37 may be activated by an annealing process, such as rapid thermal anneal. In one example, the rapid thermal annealing temperature is carried out using a temperature ranging from 750° C. to 1200° C. for a time period ranging from 1.0 second to 20.0 seconds. The anneal process may be conducted following the completion of all of the implant processing steps to reduce the thermal budget of the manufacturing process.

Still referring to FIG. 2, a spacer 42 may be formed in direct physical contact with the sidewalls of the gate structure 15. The spacer 42 may be composed of oxide, i.e., $SiO_2$, but may also comprise nitride or oxynitride materials. Each spacer 42 may have a width ranging from 50.0 nm to 100.0 nm. The spacer 42 can be formed by deposition and etch processes. For example, a conformal dielectric layer may be deposited using deposition processes, including, but not limited to, chemical vapor deposition (CVD), plasma-assisted CVD, and low-pressure chemical vapor deposition (LPCVD). Following deposition, the conformal dielectric layer is then etched to define the geometry of the spacer 42 using an anisotropic plasma etch procedure such as, reactive ion etch.

P-type deep source and drain regions 38 may be implanted into the substrate 5. Typical implant species for the p-type deep source and drain regions 38 may include boron or $BF_2$. The p-type deep source/drain diffusion region 38 can be implanted with boron utilizing an energy ranging from 1.0 keV to 8.0 keV with a dose ranging from $1 \times 10^{15}$ atoms/cm$^2$ to $7 \times 10^{15}$ atoms/cm$^2$. The p-type deep source and drain diffusion region 38 may also be implanted with $BF_2$ with an implant energy ranging from 5.0 keV to 40.0 keV and a dose ranging from $1 \times 10^{15}$ atoms/cm$^2$ to $7 \times 10^{15}$ atoms/cm$^2$.

Following p-type deep source and drain regions 38 implantation, the structure may be annealed to promote diffusion of the dopant species. In one embodiment, the anneal process step may be conducted following the completion of all of the implant processing steps to reduce the thermal budget of the manufacturing process. In one embodiment, the p-type source and drain regions may be present in an n-type well region (not shown) of the substrate 5.

FIG. 3 depicts one embodiment of forming silicide contacts 50 to the gate structure 15 and the source and drain regions, i.e., the p-type source and drain extension regions 37 and p-type deep source and drain diffusion regions 38. Silicide formation typically requires depositing a refractory metal, such as Ni, Co, or Ti, onto the surface of a Si-containing material. Following deposition, the structure is then subjected to an annealing step using thermal processes, such as rapid thermal annealing. During thermal annealing, the deposited metal reacts with Si forming a metal semiconductor alloy, e.g., silicide.

In one embodiment, a conformal layer of a dielectric material 51 may be blanket deposited atop the entire substrate to provide an etch stop layer. The conformal layer of the dielectric material 51 may be composed of a dielectric material, including but not limited to, oxide, nitrides and oxynitrides. An interlevel dielectric 52 may be deposited atop the conformal dielectric material 51. The interlevel dielectric 52 may be selected from the group consisting of silicon containing materials such as $SiO_2$, $Si_3N_4$, $SiO_xN_y$, SiC, SiCO, SiCOH, and SiCH compounds; the above-mentioned silicon containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric 52 include: any of the aforementioned materials in porous form, or in a form that changes during processing to or from being porous and/or permeable to being non-porous and/or non-permeable.

The interlevel dielectric layer 52 may be formed by various deposition, including, but not limited to, spinning from solution, spraying from solution, chemical vapor deposition (CVD), plasma enhanced CVD (PECVD), sputter deposition, reactive sputter deposition, ion-beam deposition, and evaporation. The conformal layer of a dielectric material 51 and the interlevel dielectric layer 52 are then patterned and etched to form via holes to the various source and drain and gate conductor regions of the substrate 5. Following via formation, interconnects 53 are formed by depositing a conductive metal into the via holes using deposition processing, such as CVD or plating. The conductive metal may include, but is not limited to, tungsten, copper, aluminum, silver, gold, and alloys thereof.

The above described method provides a p-type semiconductor device that positions an aluminum containing threshold voltage shift layer 14 within a gate structure 15, wherein the aluminum containing threshold voltage shift layer 14 effectuates a threshold voltage shift towards the valence band of the p-type semiconductor device. In one embodiment, threshold voltage shift provided by the aluminum containing threshold voltage shift layer 14 may be as great as 0.3 V towards the valence band of the p-type semiconductor device. It is noted that the above method may be incorporated into a replacement gate process, in which a dummy gate is present during the formation of the doped regions and the annealing of the device, wherein the dummy gate may then be replaced with a functional gate including the aluminum containing threshold voltage shift layer 14.

Referring to FIG. 3, in one embodiment, the present method may provide a p-type semiconductor device including a gate structure 15 present on a first portion 70 of a silicon containing substrate 5, in which the gate structure 15 includes at least a gate dielectric layer 13 on the silicon containing substrate 5, an aluminum containing threshold voltage shift layer 14 on the gate dielectric layer 13 and a metal nitride layer 16 on the aluminum containing threshold voltage shift layer 14. P-type source and drain regions, i.e., the p-type source and drain extension regions 37 and p-type deep source and drain diffusion regions 38, may be present in a second portion of the silicon containing substrate 5 that is adjacent to the first portion 70 of the silicon containing substrate 5 on which the gate structure 15 is present. The p-type semiconductor device may have a threshold voltage ranging from −0.35 V to −0.1 V. In one embodiment, the p-type semiconductor device has a threshold voltage ranging from −0.3 V to −0.1 V. In an even further embodiment, the p-type semiconductor device has a threshold voltage ranging from −0.25 V to −0.15 V.

The p-type semiconductor device may have an inversion thickness (Tinv) ranging from 13.5 Å to 15 Å. In another embodiment, the inversion thickness of the p-type semiconductor device ranges from 10 Å to 20 Å. In an even further embodiment, the inversion thickness of the p-type semiconductor device ranges from 11 Å to 20 Å. The p-type semiconductor device may have a mobility of charge carriers ranging from 80 $cm^2$/(v·sec) to 120 $cm^2$/(v·sec). In one embodiment, the p-type semiconductor device may have a mobility of charge carriers ranging from 80 $cm^2$/(v·sec) to 120 $cm^2$/(v·sec).

Although not depicted in FIG. 3, a second metal nitride layer may be present between the aluminum containing threshold voltage shift layer 14 and the gate dielectric layer 13. In one embodiment, the second metal nitride layer may have a thickness ranging from 25 Å to 200 Å. In another embodiment, the second metal nitride layer has a thickness ranging from 50 Å to 100 Å. The second metal nitride layer may be composed of titanium nitride (TiN), in which the titanium concentration ranges from 30% to 70%. In another example, the titanium concentration of the titanium nitride (TiN) ranges from 45% to 55%.

Figure 4:
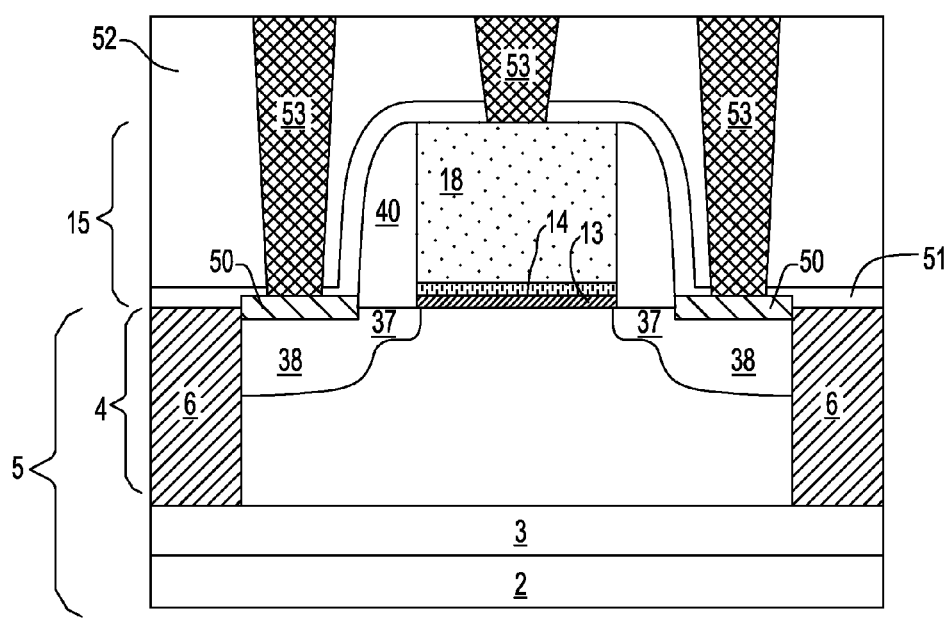
FIG. 4 is a side cross-sectional view of another embodiment of a semiconductor device in accordance with the present invention, in which the gate stack of the semiconductor device includes in order from top to bottom a metal gate conductor, an aluminum containing threshold voltage shift layer, and a gate dielectric layer.

FIGS. 4-8 depict other structural embodiments of the present invention that include an aluminum containing threshold voltage shift layer 14. FIG. 4 depicts a gate structure 15 including from top to bottom a metal gate conductor 18, an aluminum containing threshold voltage shift layer 14, and a gate dielectric layer 13, e.g., high-k gate dielectric, that is present on a surface of a semiconductor substrate 5. In the embodiment depicted in FIG. 4, a metal gate conductor 18 is substituted for the conductive semiconductor layer 17 that is composed of polysilicon. The metal gate conductor 18 may be composed of a metal nitride, such as titanium nitride (TiN) or tantalum nitride (TaN). Alternatively, the metal gate conductor 18 may be a metal selected from the group consisting of tantalum (Ta), titanium (Ti), tungsten (W) or Copper (Cu). In a further embodiment, the metal gate conductor 18 may be composed of a metal silicide, i.e., metal semiconductor alloy. Similar to the embodiment, depicted in FIG. 3, the aluminum containing threshold voltage shift layer 14 may be composed of substantially pure aluminum (Al) or titanium aluminum nitride (TiAlN). It is noted that the remaining elements that are depicted in FIG. 4 have been described above in FIGS. 1-3.

Figure 5:
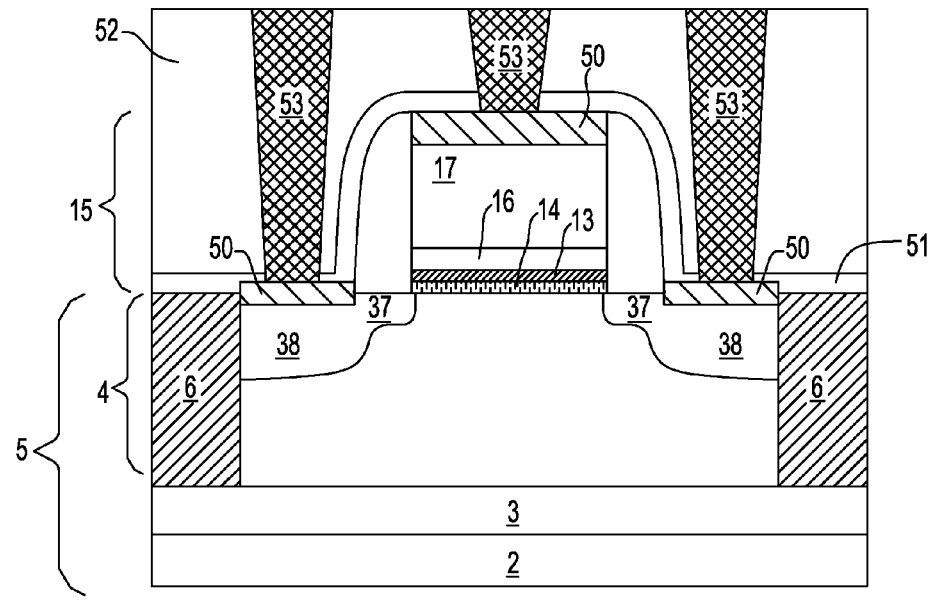
FIG. 5 is a side cross-sectional view of another embodiment of a semiconductor device in accordance with the present invention, in which the gate stack of the semiconductor device includes in order from top to bottom a polysilicon gate conductor, a metal nitride layer, a gate dielectric layer and an aluminum containing threshold voltage shift layer.

FIG. 5 depicts another embodiment of a p-type semiconductor device, in which the gate structure 15 of the p-type semiconductor device includes in order from top to bottom, a conductive semiconductor layer 17 that is composed of polysilicon, a metal nitride layer 16, a gate dielectric 13 and an aluminum containing threshold voltage shift layer 14 that is present on the surface of the semiconductor substrate 5. It is noted that a silicide contact 50 may be present on the conductive semiconductor layer 17. The silicide contact 50 may be composed of any metal semiconductor alloy. The gate dielectric 13 may be composed of a high-k dielectric. Similar to the embodiment, depicted in FIG. 3, the aluminum containing threshold voltage shift layer 14 may be composed of substantially pure aluminum (Al) or titanium aluminum nitride (TiAlN). It is noted that the remaining elements that are depicted in FIG. 4 have been described above in FIGS. 1-3.

Figure 6:
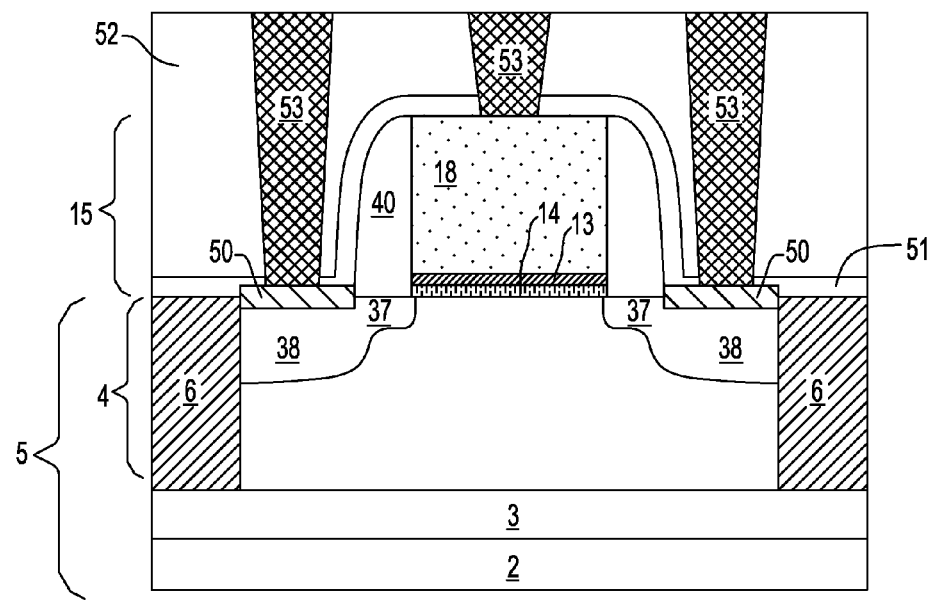
FIG. 6 is a side cross-sectional view of another embodiment of a semiconductor device in accordance with the present invention, in which the gate stack of the semiconductor device includes in order from top to bottom a metal gate conductor, a gate dielectric layer and an aluminum containing threshold voltage shift layer.

FIG. 6 is a side cross-sectional view of another embodiment of a p-type semiconductor device, in which the gate structure 15 of the p-type semiconductor device includes in order from top to bottom a metal gate conductor 18, a gate dielectric layer 13 and an aluminum containing threshold voltage shift layer 14 that is present on the surface of the semiconductor substrate 5. It is noted that a silicide contact 50 may be present on the conductive semiconductor layer 17. The silicide contact 50 may be composed of any metal semiconductor alloy. In the embodiment depicted in FIG. 6, a metal gate conductor 18 is substituted for the conductive semiconductor layer 17 that is composed of polysilicon that is depicted in FIG. 5. The metal gate conductor 18 may be composed of a metal nitride, such as titanium nitride (TiN) or tantalum nitride (TaN). Alternatively, the metal gate conductor 18 may be a metal selected from the group consisting of tantalum (Ta), titanium (Ti), tungsten (W) and Copper (Cu). The gate dielectric layer 13 may be composed of a high-k dielectric. Similar to the embodiment depicted in FIG. 3, the aluminum containing threshold voltage shift layer 14 may be composed of substantially pure aluminum (Al) or titanium aluminum nitride (TiAlN). It is noted that the remaining elements that are depicted in FIG. 4 have been described above in FIGS. 1-3.

Figure 7:
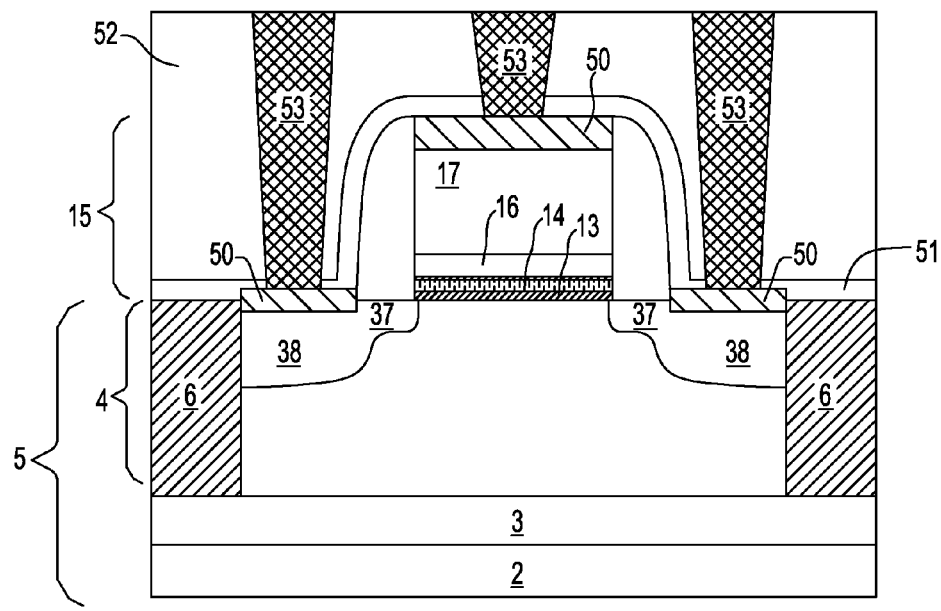
FIG. 7 is a side cross-sectional view of another embodiment of a semiconductor device in accordance with the present invention, in which the gate stack of the semiconductor device includes in order from top to bottom a polysilicon gate conductor, a metal nitride layer, and a gate dielectric layer, in which an aluminum containing threshold voltage shift layer is embedded in the gate dielectric layer.

FIG. 7 depicts another embodiment of a p-type semiconductor device in accordance with the present invention. In the embodiment depicted in FIG. 7, the gate stack of the p-type semiconductor device includes in order from top to bottom a conductive semiconductor layer 17 that is composed of polysilicon, a metal nitride layer 16, and a gate dielectric layer 13, in which an aluminum containing threshold voltage shift layer 14 is embedded in the gate dielectric layer 13. By embedded it is meant that the aluminum containing threshold voltage shift layer 14 is present within the gate dielectric layer 13 so that a lower portion of the gate dielectric layer 13 is present below the aluminum containing threshold voltage shift layer 14, and an upper portion of the gate dielectric layer 13 is present above the aluminum containing threshold voltage shift layer. The gate dielectric layer 13 may be composed of a high-k dielectric. The aluminum containing threshold voltage shift layer 14 may be composed of substantially pure aluminum (Al) or titanium aluminum nitride (TiAlN). It is noted that the remaining elements that are depicted in FIG. 4 have been described above in FIGS. 1-3.

Figure 8:
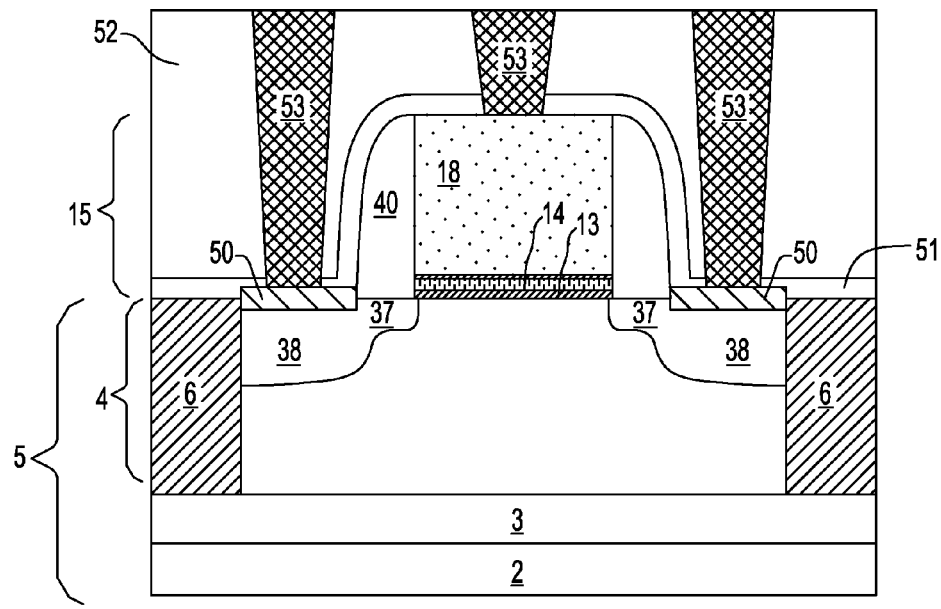
FIG. 8 is a side cross-sectional view of another embodiment of a semiconductor device in accordance with the present invention, in which the gate structure of the semiconductor device includes from top to bottom a metal gate conductor, and a gate dielectric layer having an aluminum containing threshold voltage shift layer embedded therein, in accordance with the present invention.

FIG. 8 depicts another embodiment of a p-type semiconductor device in accordance with the present invention, in which the gate structure 15 of the p-type semiconductor device includes a metal gate conductor 18, and a gate dielectric layer 13 having an aluminum containing threshold voltage shift layer 14 embedded therein. In the embodiment depicted in FIG. 8, a metal gate conductor 18 is substituted for the conductive semiconductor layer 17 that is composed of polysilicon that is depicted in FIG. 7. The metal gate conductor 18 may be composed of a metal nitride, such as titanium nitride (TiN) or tantalum nitride (TaN). Alternatively, the metal gate conductor 18 may be a metal selected from the group consisting of tantalum (Ta), titanium (Ti), tungsten (W) and copper (Cu). In an even further embodiment, the metal gate conductor may be 18 may be composed of a metal semiconductor alloy, i.e., silicide. The gate dielectric 13 may be composed of a high-k dielectric. The aluminum containing threshold voltage shift layer 14 may be composed of substantially pure aluminum (Al) or titanium aluminum nitride (TiAlN). It is noted that the remaining elements that are depicted in FIG. 4 have been described above in FIGS. 1-3.

Although some embodiments of the invention have been described generally above, the following examples are provided to further illustrate the present invention and demonstrate some advantages that arise therefrom. It is not intended that the invention be limited to the specific examples disclosed.

EXAMPLES

Test samples of p-type semiconductor devices (10 micron (width)×10 micron (length)), i.e., field effect transistors, were produced incorporating an aluminum containing threshold voltage shift layer within the gate structure of the p-type semiconductor device. Table 1 includes the composition of the aluminum containing threshold voltage shift layer. Specifically, Table 1 illustrates the composition of the initial aluminum containing material (aluminum deposition composition) being deposited atop the gate dielectric layer, and the time period for deposition of the aluminum containing material. Samples 2-8 included an initial aluminum containing material being deposited by sputtering from a high purity aluminum target. The time period for sputtering of the aluminum containing material from the high purity aluminum target ranged from 2-24 seconds, which typically equated to a substantially pure aluminum layer having a thickness of less than 5 Å. Sample 1 is a titanium nitride deposited layer having no aluminum present therein. Samples 9-14 included an initial aluminum containing material composed of titanium aluminum nitride (TiAlN) being deposited by sputtering from a TiAl target, in which the nitrogen was introduced by $N_2$ gas. Each of the samples included a metal nitride layer composed of titanium nitride deposited overlying the aluminum containing threshold voltage shift layer by sputtering.

TABLE 1

| SAMPLE # | aluminum deposition composition | aluminum deposition time (sec) | metal nitride/oxidation |
|---|---|---|---|
| 1 | Aluminum (Al) | 0 | Titanium nitride (TiN) |
| 2 | Aluminum (Al) | 2 | Titanium nitride (TiN) |
| 3 | Aluminum (Al) | 4 | Titanium nitride (TiN) |
| 4 | Aluminum (Al) | 8 | Titanium nitride (TiN) |
| 5 | Aluminum (Al) | 12 | Titanium nitride (TiN) |
| 6 | Aluminum (Al) | 16 | Titanium nitride (TiN) |
| 7 | Aluminum (Al) | 20 | Titanium nitride (TiN) |
| 8 | Aluminum (Al) | 24 | Titanium nitride (TiN) |
| 9 | Titanium Aluminum Nitride (TiAlN) | 2 | Titanium nitride (TiN) |
| 10 | Titanium Aluminum Nitride (TiAlN) | 4 | Titanium nitride (TiN) |
| 11 | Titanium Aluminum Nitride (TiAlN) | 8 | Titanium nitride (TiN) |
| 12 | Titanium Aluminum Nitride (TiAlN) | 12 | Titanium nitride (TiN) |
| 13 | Titanium Aluminum Nitride (TiAlN) | 16 | Titanium nitride (TiN) |
| 14 | Titanium Aluminum Nitride (TiAlN) | 20 | Titanium nitride (TiN) |

Figure 9:
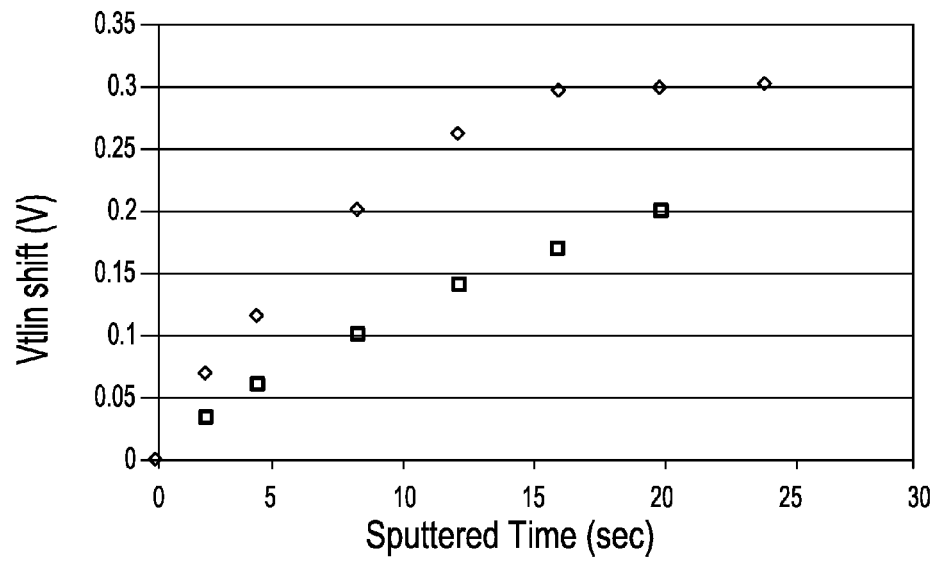
FIG. 9 is a plot of threshold voltage (V) as a function of the deposition period for a p-type semiconductor device having a gate structure including an aluminum containing threshold voltage shift layer, in accordance with some embodiments of the present invention.

FIG. 9 is a plot of measurements of the threshold voltage (V) of samples 1-14 included in Table 1 as a function of the aluminum deposition period of the aluminum containing threshold voltage shift layer. FIG. 9 illustrates that the aluminum containing threshold voltage shift layer provides a shift in threshold voltage from −0.4 V, as measured from a p-type semiconductor device that does not include the aluminum containing threshold voltage shift layer, to −0.1 V, in which the shift in threshold voltage increases with increasing aluminum deposition time.

Figure 10:
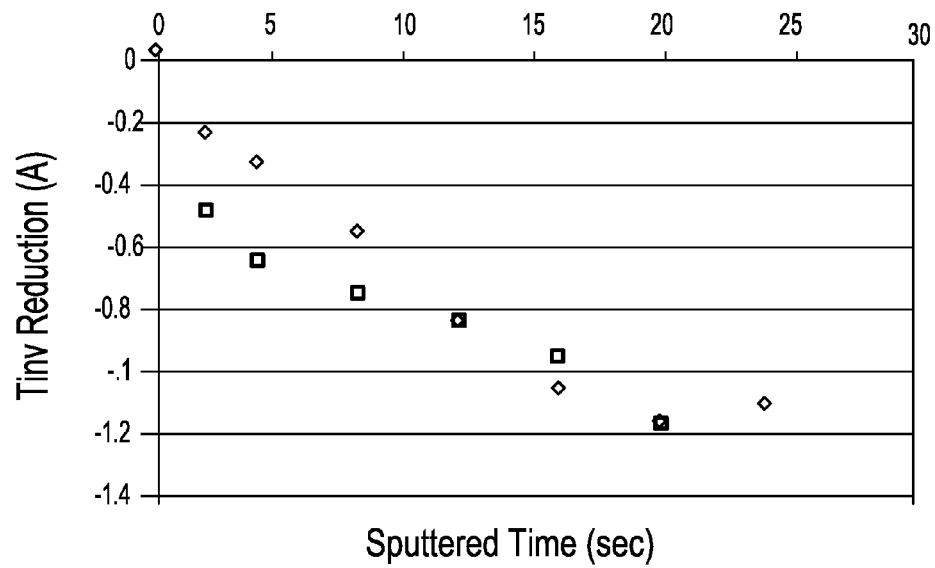
FIG. 10 is a plot of inversion thickness (Tinv) as a function of the deposition period for the aluminum containing threshold voltage shift layer, in accordance with some embodiments of the present invention.

FIG. 10 is a plot of inversion thickness (Tinv) (inversion C-V measured at 1 MHz frequency) of samples 1-14 included in Table 1 as a function of the deposition period for the aluminum containing threshold voltage shift layer. FIG. 10 illustrates through samples 1-14 that the inversion thickness (Tinv) of the p-type semiconductor devices decreases within increasing aluminum content, i.e., increasing aluminum deposition time, of the aluminum containing threshold voltage shift layer on the gate dielectric. The thinner the inversion thickness (Tinv), the higher the drive current of the p-type semiconductor device. The thicker the inversion thickness (Tinv), the lower the drive current of the p-type semiconductor device. FIG. 10 illustrates that the inversion thickness (Tinv) decreases with increasing aluminum content of the aluminum containing threshold voltage shift layer, which results in a higher drive current in the p-type semiconductor device including the aluminum containing threshold voltage shift layer.

Figure 11:
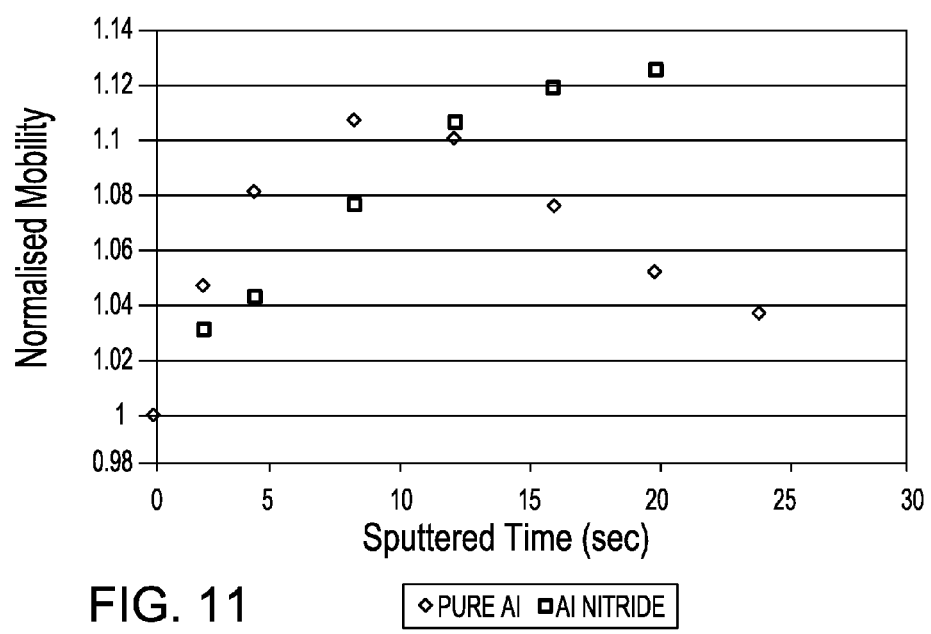
FIG. 11 is a plot of carrier mobility as a function of the deposition period for a p-type semiconductor device having a gate structure including an aluminum containing threshold voltage shift layer, in accordance with some embodiments of the present invention.

FIG. 11 is a plot of carrier mobility (μ) for samples 1-14 that are included in Table 1. FIG. 11 depicts normalized data. The carrier mobility was measured as a function of the deposition period for the aluminum containing threshold voltage shift layer. FIG. 11 illustrates that peak mobility in p-type semiconductor devices is provided by aluminum containing threshold voltage shift layers with an initial aluminum containing material sputtered from a high purity aluminum target for deposition times ranging from 8 to 12 seconds. The deposition time ranging from 8 to 12 seconds correlates to a thickness of the aluminum containing threshold voltage shift layer that ranges from 2 Å to 5 Å.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A p-type semiconductor device comprising:

a gate structure present on a first portion of a semiconductor substrate, the gate structure comprising an aluminum containing threshold voltage shift layer of substantially pure aluminum having an aluminum purity of 99.5% or greater or TiAlN present on and in direct contact with the semiconductor substrate, a gate dielectric layer present on the aluminum containing threshold voltage shift layer, a metal nitride layer in direct contact with the gate dielectric layer, and a gate conductor in direct contact with the metal nitride layer; and p-type source and drain regions present in a portion of the semiconductor substrate that is adjacent to the first portion of the semiconductor substrate on which the gate structure is present, wherein the p-type semiconductor device has a threshold voltage ranging from −0.35 V to −0.1 V.

2. The p-type semiconductor device of claim 1, wherein the semiconductor device has an inversion thickness (Tinv) ranging from 13.5 Å to 15 Å.

3. The method of claim 1, wherein the metal nitride layer is substantially free of aluminum and is composed of TiN, TaN, WN or a combination thereof.

4. The p-type semiconductor device of claim 1, wherein the gate dielectric layer comprises $SiO_2$, $Al_2O_3$, $ZrO_2$, $HfO_2$, $Ta_2O_3$, $TiO_2$, perovskite-type oxides or combinations and multi-layers thereof.

5. The p-type semiconductor device of claim 1, wherein the gate conductor comprises a metal, a semiconductor or a metal semiconductor alloy.

6. A method of adjusting threshold voltage in a p-type semiconductor device comprising:

forming an aluminum containing threshold voltage shift layer of a gate structure directly on a first portion of a semiconductor substrate between a p-type source region and a p-type drain region of the p-type semiconductor device, wherein the aluminum containing threshold voltage shift layer is composed of an aluminum containing material selected from the group consisting of substantially pure aluminum having an aluminum purity of 99.5% or greater or TiAlN;

forming a gate dielectric layer on the aluminum containing threshold voltage shift layer; and forming a metal nitride layer that is substantially free of aluminum on the gate dielectric layer.

7. The method of claim 6, further comprising forming a gate conductor on the metal nitride layer.

8. The method of claim 6, wherein the metal nitride layer composed of TiN, TaN, WN or a combination thereof.

* * * * *